United States Patent
Tamura

(10) Patent No.: US 8,952,687 B2
(45) Date of Patent: Feb. 10, 2015

(54) CURRENT SENSOR

(71) Applicant: Alps Green Devices Co., Ltd., Tokyo (JP)

(72) Inventor: Manabu Tamura, Miyagi-ken (JP)

(73) Assignee: Alps Green Devices Co., Ltd., Tokyo (JP)

( * ) Notice: Subject to any disclaimer, the term of this patent is extended or adjusted under 35 U.S.C. 154(b) by 207 days.

(21) Appl. No.: 13/766,677

(22) Filed: Feb. 13, 2013

(65) Prior Publication Data

US 2013/0154631 A1    Jun. 20, 2013

Related U.S. Application Data

(63) Continuation of application No. PCT/JP2011/066809, filed on Jul. 25, 2011.

(30) Foreign Application Priority Data

Aug. 31, 2010 (JP) ................................. 2010-194175

(51) Int. Cl.
- *G01R 33/02* (2006.01)
- *G01R 33/07* (2006.01)
- *G01R 19/00* (2006.01)
- *G01R 15/20* (2006.01)

(52) U.S. Cl.
CPC .......... *G01R 19/0038* (2013.01); *G01R 15/207* (2013.01); *G01R 19/0053* (2013.01)
USPC .................... 324/244; 324/117 R; 324/117 H

(58) Field of Classification Search
USPC ................................... 324/244, 117 R, 117 H
See application file for complete search history.

(56) References Cited

U.S. PATENT DOCUMENTS

2009/0121704 A1    5/2009    Shibahara

FOREIGN PATENT DOCUMENTS

| JP | 10-142263 | 5/1998 |
| JP | 2002-243766 | 8/2002 |
| WO | WO 2006/090769 | 8/2006 |

OTHER PUBLICATIONS

Search Report dated Oct. 25, 2011 from International Application No. PCT/JP2011/066809.

*Primary Examiner* — Reena Aurora
(74) *Attorney, Agent, or Firm* — Beyer Law Group LLP

(57) ABSTRACT

A current sensor includes: a conductive member through which a current to be measured flows; first and second magnetic sensors which output signals having reversed phases to each other due to an induction magnetic field from the current to be measured; and a control unit which performs differential operation on the output signal of the first magnetic sensor and the output signal of the second magnetic sensor, wherein sensing axis directions of the first magnetic sensor and the second magnetic sensor are fixed in the same direction, form a predetermined angle with respect to an application direction of the induction magnetic field from the current to be measured applied to the first magnetic sensor and the second magnetic sensor, and are fixed so that the induction magnetic fields are applied to the first magnetic sensor and the second magnetic sensor in reverse directions to each other.

5 Claims, 3 Drawing Sheets

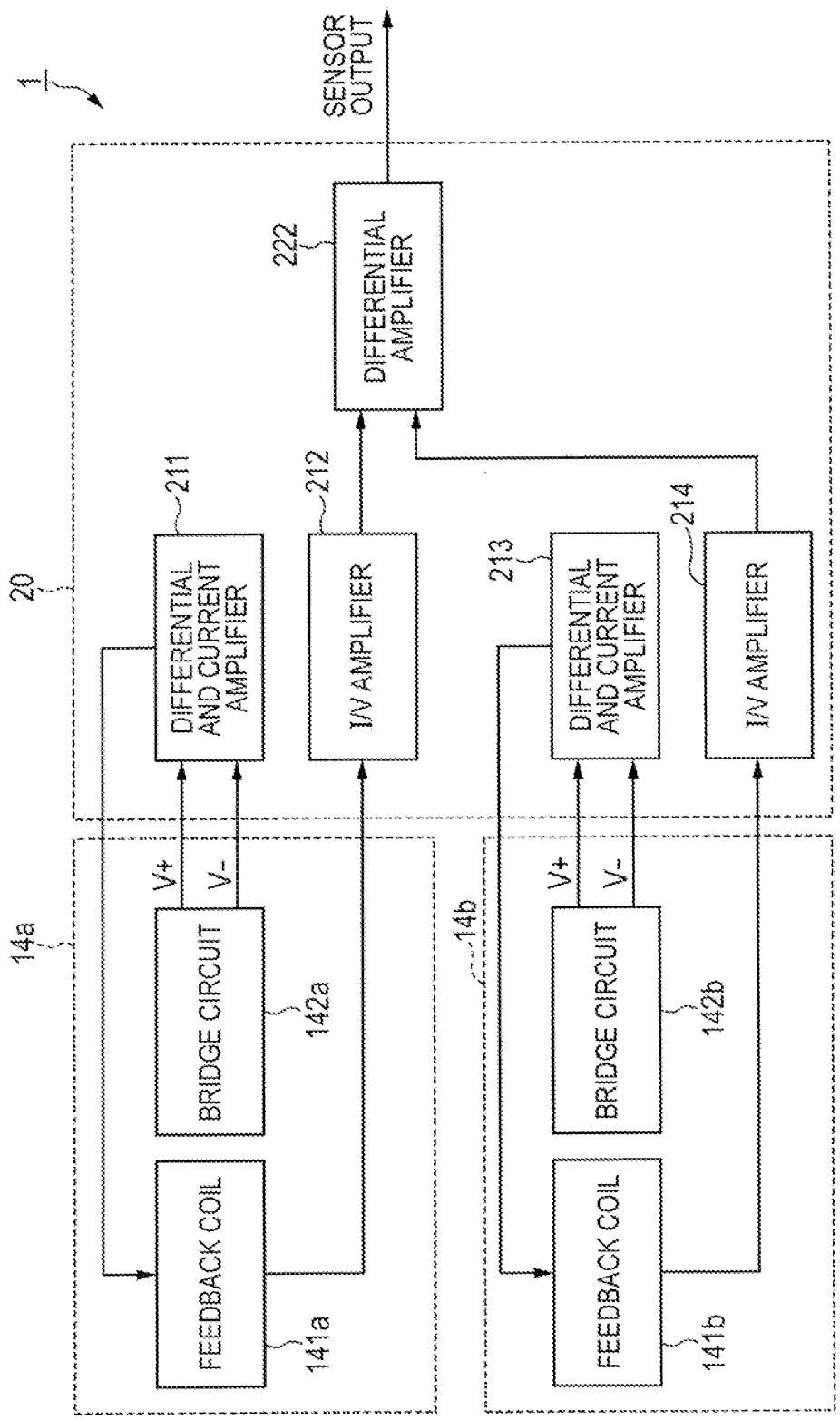

EMBODIMENT

COMPARATIVE EXAMPLE

CURRENT SENSOR

CLAIM OF PRIORITY

This application is a Continuation of international Application No. PCT/JP2011/066809 filed on Jul. 25, 2011, which claims benefit of Japanese Patent Application No. 2010-194175 filed on Aug. 31, 2010. The entire contents of each application noted above are hereby incorporated by reference.

BACKGROUND OF THE INVENTION

1. Field of the Invention

The present invention relates to a current sensor that measures the magnitude of current, and more particularly, to a current sensor capable of reducing noise from disturbance magnetism.

2. Description of the Related Art

In recent years, in fields such as an electric vehicle and a solar battery, a current value that is involved has been increased due to increases in output and performance of the electric vehicle or the solar battery device, and a current sensor that contactlessly measures a high DC current has been widely used. As such a current sensor, a sensor including a magnetic sensor that detects a current to be measured, which flows through a conductor, using a change in magnetic field in the periphery of the conductor has been suggested. In addition, as the current sensor, a current sensor that reduces noise from disturbance magnetism has been developed.

As the current sensor that reduces noise from disturbance magnetism, a current sensor which acquires a differential between output signals of a pair of magnetic sensors disposed on the same substrate has been suggested (for example, refer to Japanese Unexamined Patent Application Publication No. 2002-243766). In the current sensor, the pair of magnetic sensors are disposed on the substrate at positions that oppose each other with a current line interposed therebetween, which is orthogonal to the substrate. The sensing axis directions of the pair of magnetic sensors are the same direction. In the current sensor, since the output signals having reversed phases to each other are output from the pair of magnetic sensors, the output signals are processed to be added to each other by differential operation and thus output sensitivity is enhanced. In addition, noise components other than the output signals of the pair of magnetic sensors have the same phase and thus are removed by the differential operation.

However, in a case where the magnitude of current for driving the motor of an electric vehicle is measured by the current sensor, the current to be measured becomes a high current during motor driving and becomes a minute current during motor stoppage. Therefore, a current sensor capable of measuring both the high current and the minute current with high accuracy is preferable. In addition, with an expansion of applications of the current sensor in recent years, further reductions in the size and the thickness of the current sensor are preferable. In terms of the reductions in the size and the thickness of the current sensor, it is preferable that the magnetic sensors be disposed in the vicinity of the current line.

However, in the current sensor described in Unexamined Patent Application Publication No. 2002-243766, in the case where the pair of magnetic sensors are disposed in the vicinity of the current line, there is a problem in that the pair of magnetic sensors become magnetically saturated by an induction magnetic field from the current to be measured, which flows through the current line. Particularly, in a case where the current to be measured which is an object of measurement is a high current, the induction magnetic field from the current to be measured is increased, and thus the magnetic sensors are likely to become magnetically saturated. As such, in the current sensor according to the related art, it is difficult to realize both the measurement of the current to be measured, which is a high current, and the reductions in the size and the thickness of the current sensor.

SUMMARY OF THE INVENTION

The present invention provides a current sensor capable of reducing noise from disturbance magnetism, measuring a current to be measured, which is a high current, and realizing reductions in size and thickness.

According to an aspect of the present invention, there is provided a current sensor including: a conductive member through which a current to be measured flows; a first magnetic sensor and a second magnetic sensor which output signals having reversed phases to each other due to an induction magnetic field from the current to be measured; and a differential unit which performs differential operation on the output signal of the first magnetic sensor and the output signal of the second magnetic sensor, wherein sensing axis directions of the first magnetic sensor and the second magnetic sensor are fixed in the same direction, form a predetermined angle with respect to an application direction of the induction magnetic field from the current to be measured applied to the first magnetic sensor and the second magnetic sensor, and are fixed so that the induction magnetic fields are applied to the first magnetic sensor and the second magnetic sensor in reverse directions to each other.

A substrate having the first magnetic sensor disposed on one surface and the second magnetic sensor disposed on the other surface is included, the conductive member forms a shape having a longitudinal direction and a lateral direction in a cross-sectional view, and the substrate is disposed to be parallel to the conductive member in the longitudinal direction so that an in-plane direction of the substrate and the longitudinal direction are substantially parallel to each other.

In this configuration, since the first magnetic sensor and the second magnetic sensor are disposed with the substrate interposed therebetween, which is disposed to be parallel to the conductive member, the thickness of the current sensor may be reduced, and the reductions in the size and the thickness of the current sensor are possible. Moreover, since the first magnetic sensor and the second magnetic sensor are disposed with the substrate interposed therebetween, the difference between disturbance magnetism applied to the first magnetic sensor and disturbance magnetism applied to the second magnetic sensor may be reduced, thereby effectively reducing an influence of noise due to the disturbance magnetism.

In the current sensor according to the aspect of the present invention, a position at a center in a thickness direction of the substrate may be disposed at the same position with respect to a position at a center in a height direction of the conductive member.

In this configuration, the thickness of the current sensor may be reduced, and the reductions in the size and the thickness of the current sensor are possible. Moreover, the difference between magnetic vectors in the sensing axis directions of the induction magnetic field applied to the first magnetic sensor and the second magnetic sensor may be reduced, and thus the detection accuracy of the current sensor may be particularly enhanced.

In the current sensor according to the aspect of the present invention, the conductive member may have a rectangular shape in the cross-sectional view. In this configuration, a change in the application direction of the induction magnetic field in the vicinity of the end portions in the lateral direction of the conductive member increases. Therefore, the magnetic vectors in the sensing axis directions of the first magnetic sensor and the second magnetic sensor may be reduced, and thus it is possible to measure the current to be measured, which is a high current.

In the current sensor according to the aspect of the present invention, the first magnetic sensor and the second magnetic sensor may be magnetoresistance elements.

BRIEF DESCRIPTION OF THE DRAWINGS

FIG. 4 is a function block diagram illustrating the current sensor according to the embodiment of the present invention.

DESCRIPTION OF THE PREFERRED EMBODIMENTS

Hereinafter, an embodiment of the present invention will be described in detail with reference to the accompanying drawings.

Figure 1:
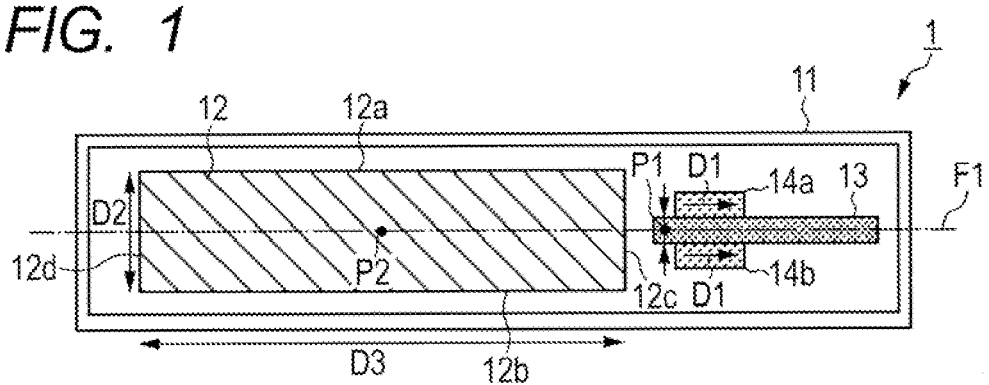
FIG. 1 is a cross-sectional schematic view of a current sensor according to an embodiment of the present invention.

FIG. 1 is a cross-sectional schematic view of a current sensor according to this embodiment. As illustrated in FIG. 1, the current sensor 1 according to this embodiment includes a case 11 having a space therein, and a conductive member 12 of which a part is disposed in the case 11 and which extends in one direction. In the conductive member 12 in the case 11, a pair of first and second magnetic sensors 14a and 14b arranged via a substrate 13 are disposed, and the magnitude of a current to be measured, which flows through the conductive member 12, is measured by the first and second magnetic sensors 14a and 14b. In addition, in FIG. 1, a cross-sectional schematic view in a vertical direction with respect to the extension direction of the conductive member 12 is illustrated.

The case 11 is formed of, for example, an insulating material, but a part thereof may also be configured to include a material having high magnetic permeability such as silicon steel or permalloy and be configured to shield disturbance magnetism in the case 11. The conductive member 12 has a rectangular shape in a cross-sectional view, and has a pair of main surfaces 12a and 12b at both ends in a lateral direction D2 and a pair of end surfaces 12c and 12d at both ends in a longitudinal direction D3.

The substrate 13 is supported by a support member (not shown) between one end surface 12c and the case 11 in the longitudinal direction D3 of the conductive member 12 and is disposed to be parallel to the conductive member 12 so that the in-plane direction of the substrate 13 and the longitudinal direction D3 are parallel to each other. In addition, the in-plane direction of the substrate 13 may not be completely parallel to the longitudinal direction D3 and may be substantially parallel thereto in a range in which the effect of the present invention is exhibited. In addition, the substrate 13 is disposed so that a position at the center (point P1) in the thickness direction is aligned with a position at the center (point P2) in the height direction (the lateral direction D2) of the conductive member 12 (see F1). On one surface (hereinafter, referred to as an "upper surface") of the substrate 13, the first magnetic sensor 14a is disposed, and under the other surface (hereinafter, referred to as a "lower surface") of the substrate 13, the second magnetic sensor 14b is disposed. In addition, on the substrate 13, a control unit 20 (see FIG. 4) which operates and processes the output signals of the first and second magnetic sensors 14a and 14b is provided.

The first and second magnetic sensors 14a and 14b output the output signals depending on an induction magnetic field M1 (see FIG. 2) from the current to be measured, which flows through the conductive member 12. In addition, the first and second magnetic sensors 14a and 14b are disposed so that the sensing axis directions D1 thereof are fixed in the same direction as the longitudinal direction D3 of the conductive member 12 and the induction magnetic field M1 (see FIG. 2) from the current to be measured is applied at a predetermined angle θ with respect to the sensing axis direction D1. In addition, the sensing axis direction D1 may not be completely the same direction as the longitudinal direction D3 of the conductive member 12 and may be substantially the same direction in a range in which the effect of the present invention is exhibited.

Figure 2:
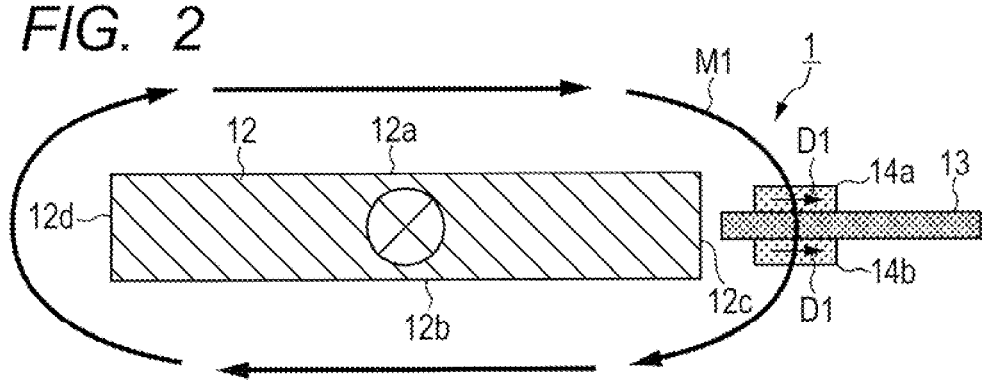
FIG. 2 is an explanatory view of an induction magnetic field in the current sensor according to the embodiment of the present invention.
Figure 3:
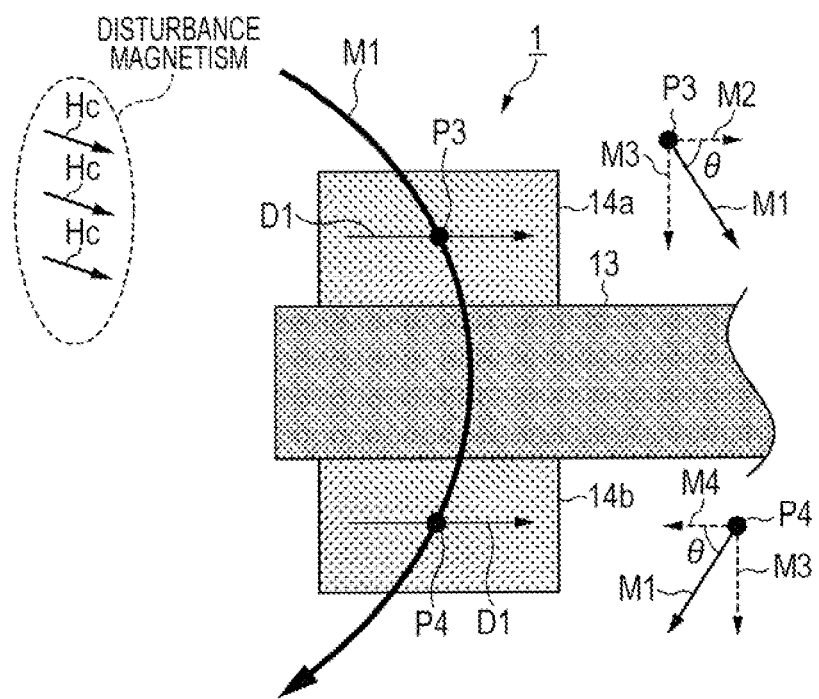
FIG. 3 is a partial enlarged view of the explanatory view of the induction magnetic field in the current sensor according to the embodiment of the present invention.

Next, the induction magnetic field M1 during measurement of the current to be measured of the current sensor 1 according to this embodiment will be described with reference to FIGS. 2 and 3. FIG. 2 is an explanatory view of the induction magnetic field in the current sensor 1 according to this embodiment, and FIG. 3 is a partial enlarged view of the first and second magnetic sensors 14a and 14b illustrated in FIG. 2. In addition, in FIG. 2, a cross-sectional schematic view of the current sensor 1 is illustrated, and for the convenience of description, the case 11 is omitted.

As illustrated in FIG. 2, when the current to be measured flows through the conductive member 12, the induction magnetic field M1 is generated in a predetermined range from the outer peripheral edge of the conductive member 12 around the conductive member 12 as the center. The induction magnetic field M1 is in a rightward direction with respect to the flowing direction of the current to be measured. Therefore, in the vicinity of the center portion of the main surface 12a on the upper surface side of the conductive member 12, the direction of the induction magnetic field M1 becomes a rightward direction (leftward direction), and in the vicinity of the center portion of the main surface 12b on the lower surface side of the conductive member 12, the direction of the induction magnetic field M1 becomes a leftward direction (rightward direction).

In addition, in the vicinities of the end surfaces 12c and 12d of the conductive member 12, the direction of the induction magnetic field M1 changes to a curve shape from one end side toward the other end side of the end surfaces 12c and 12d in the cross-sectional view. Therefore, the induction magnetic field M1 is applied to the first and second magnetic sensors 14a and 14b disposed in the vicinity of the end surface 12c of the conductive member 12 in a direction tilted with respect to the sensing axis direction D1.

Next, the direction of the induction magnetic field M1 applied to the first and second magnetic sensors 14a and 14b will be described in detail with reference to FIG. 3. As illustrated in FIG. 3, to the first magnetic sensor 14a disposed on the upper surface side of the conductive member 12, the induction magnetic field M1 is applied in a direction at a predetermined angle θ with respect to the sensing axis direction D1 (rightward direction). In addition, to the second magnetic sensor 14b disposed on the lower surface side of the conductive member 12, the induction magnetic field M1 is applied in a direction at the predetermined angle θ with respect to the reverse direction (leftward direction) to the sensing axis direction D1.

Here, the induction magnetic field M1 applied to a center point P3 of the first magnetic sensor 14a is decomposed into a magnetic vector M2 in the sensing axis direction D1 and a magnetic vector M3 in a perpendicular direction to the surface of the substrate 13. Therefore, the output signal output from the first magnetic sensor 14a is output as an output signal depending on the magnitude of the magnetic vector M2.

In addition, the induction magnetic field M1 applied to a center point P4 of the second magnetic sensor 14b in the application direction is decomposed into a magnetic vector M4 in the reverse direction to the sensing axis direction D1 and a magnetic vector M3 in the perpendicular direction to the surface of the substrate 13. Therefore, the output signal output from the second magnetic sensor 14b is output as an output signal depending on the magnitude of the magnetic vector M4.

That is, in the current sensor 1 according to this embodiment, the induction magnetic field M1 from the current to be measured is applied to the first and second magnetic sensors 14a and 14b by being decomposed into the magnetic vectors M2 and M4 in the reverse directions to each other. Therefore, even in the case where the current to be measured is a high current, magnetic saturation of the first and second magnetic sensors 14a and 14b may be suppressed.

In addition, the induction magnetic field M1 is applied to the first magnetic sensor 14a in the direction at the predetermined angle θ from the sensing axis direction D1, and the induction magnetic field M1 is applied to the second magnetic sensor 14b in the direction at the predetermined angle θ from the reverse direction to the sensing axis direction D1. Therefore, the output signals having reversed phases to each other are output from the first and second magnetic sensors 14a and 14b. Moreover, since the induction magnetic field M1 is applied at substantially the same angle θ with respect to the sensing axis directions D1 of the first and second magnetic sensors 14a and 14b, the magnitudes of the magnetic vectors M2 and M4 of the sensing axis directions D1 are substantially the same. Therefore, the output signals output from the first and second magnetic sensors 14a and 14b have substantially the same magnitude. Moreover, since the sensing axis directions D1 of the first and second magnetic sensors 14a and 14b are fixed in substantially the same direction, substantially the same output signals having the same phase are output under disturbance magnetism Hc. Therefore, by performing differential operation on the output signals of the first and second magnetic sensors 14a and 14b, the output signals from the induction magnetic field M1 are processed to be added to each other, and thus noise components from the disturbance magnetism are removed as the same phase. Accordingly, it is possible to enhance the measurement accuracy of the current sensor 1.

FIG. 4 is a function block diagram illustrating the current sensor according to the embodiment of the present invention. The first and second magnetic sensors 14a and 14b are magnetic balance type sensors and are respectively constituted by feedback coils 141a and 141b disposed to be able to generate a magnetic field in a direction in which the magnetic field generated by the current to be measured is canceled, and bridge circuits 142a and 142b each of which includes two magnetoresistance elements that are magnetic detection elements and two fixed resistance elements. The control unit 20 includes a differential and current amplifier 211 which amplifies differential outputs of the bridge circuit 142a of the first magnetic sensor 14a and controls a feedback current of the feedback coil 141a, an I/V amplifier 212 which converts the feedback current of the first magnetic sensor 14a to a voltage, a differential and current amplifier 213 which amplifies differential outputs of the bridge circuit 142b of the second magnetic sensor 14b and controls a feedback current of the feedback coil 141b, an I/V amplifier 214 which converts the feedback current of the second magnetic sensor 14b to a voltage, and a differential amplifier 222 which amplifies the differential outputs of I/V amplifiers 212 and 214.

The feedback coils 141a and 141b are respectively disposed near the magnetoresistance elements of the bridge circuits 142a and 142b and generate cancellation magnetic fields that cancel the induction magnetic field generated by the current to be measured. GMR (Giant Magneto Resistance) elements, TMR (Tunnel Magneto Resistance) elements, and the like may be exemplified as the magnetoresistance elements of the bridge circuits 142a and 142b. The resistance of the magnetoresistance element varies due to application of the induction magnetic field from the current to be measured. Each of the bridge circuits 142a and 142b is constituted by using the two magnetoresistance elements and the two fixed resistance elements, thereby realizing a current sensor with high sensitivity. In addition, by using the magnetoresistance element, the sensing axis is easily disposed in a direction parallel to the substrate surface on which the current sensor is installed, enabling a planar coil to be used.

Each of the bridge circuits 142a and 142b has two outputs that cause a voltage difference due to the induction magnetic field M1 caused by the current to be measured. The two outputs of each of the bridge circuits 142a and 142b are respectively amplified by the differential and current amplifiers 211 and 213, and the amplified outputs are provided as currents (feedback currents) to the feedback coils 141a and 141b. The feedback currents correspond to voltage differences due to the induction magnetic field M1. Here, cancellation magnetic fields that cancel the induction magnetic field M1 are generated by the feedback coils 141a and 141b. In addition, currents that flow through the feedback coils 141a and 141b when a balanced state in which the induction magnetic field M1 and the cancellation magnetic field cancel each other is achieved are converted into voltages by the I/V amplifiers 212 and 214, and the voltages become the sensor outputs.

In the differential and current amplifier 211, by setting a power supply voltage to a value close to a value of the reference voltage for I/V conversion+(the maximum value of the rating of the feedback coil resistance×the feedback coil current at full scale), the feedback current is automatically restricted, achieving an effect of protection of the magnetoresistance elements and the feedback coil. Here, the differential between the two outputs of each of the bridge circuits 142a and 142b is amplified to be used as the feedback current. Alternatively, only midpoint potentials may be output from the bridge circuits to be used as feedback currents based on potential differences from a predetermined reference potential.

The differential amplifier 222 processes the differential value between the output signals of the I/V amplifiers 212 and 214 as a sensor output. By performing this processing, an influence of an external magnetic field such as geomagnetism on the output signals of the first and second magnetic sensors 14a and 14b is canceled, thereby measuring currents with higher accuracy. In this example, the magnetic balance type is exemplified. Alternatively, a magnetic proportion type in which a differential is acquired from the outputs of the first and second magnetic sensors as they are may also be employed.

Next, an example performed to clarify the effect of the present invention will be described.

Figure 5A:
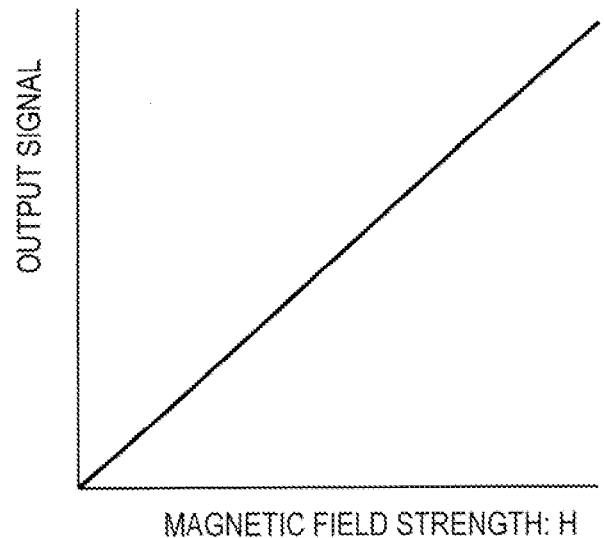
FIG. 5A is a diagram illustrating the relationship between the magnetic field strength and the output signal of the current sensor according to the embodiment of the present invention.
Figure 5B:
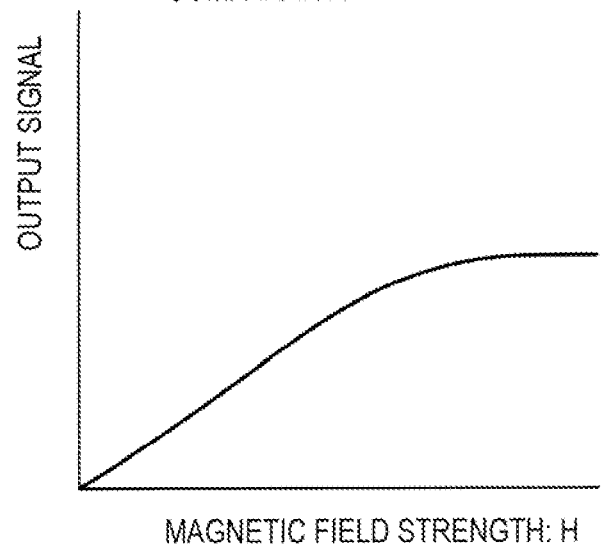
FIG. 5B is a diagram illustrating the relationship between the magnetic field strength and the output signal of the current sensor according to a comparative example.

Here, description will be provided by comparing a measurement range of the current to be measured of the current sensor 1 according to this embodiment to a measurement range of a current to be measured of a current sensor according to the related art as a comparative example. FIG. 5A is a diagram illustrating the relationship between the magnetic field strength and the output signal of the current sensor 1 according to this embodiment, and FIG. 5B is a diagram illustrating the relationship between the magnetic field strength and the output signal of the current sensor according to the comparative example. In addition, in FIGS. 5A and 5B, output signals in a case where induction magnetic fields having the same strength are applied to the current sensor 1 according to this embodiment and the current sensor according to the comparative example are illustrated.

As illustrated in FIGS. 5A and 5B, in the current sensor 1 according to this embodiment, the output signal linearly changes with respect to the magnetic field strength applied by the induction magnetic field from the current to be measured. On the other hand, in the current sensor according to the comparative example, magnetic saturation in which an increase in the output signal is reduced as the magnetic strength is increased occurs. As such, according to the current sensor 1 according to this embodiment, it is found that magnetic saturation may be suppressed even in the case where the current to be measured is a high current.

As described above, in the current sensor 1 according to this embodiment, the sensing axis directions D1 of the first and second magnetic sensors 14a and 14b are disposed to form the predetermined angle θ with respect to the application direction of the induction magnetic field M1 from the current to be measured applied to the first and second magnetic sensors 14a and 14b. Accordingly, the output signal depending on the magnetic vector M2 in the sensing axis direction D1 is output from the first magnetic sensor 14a, and the output signal depending on the magnetic vector M4 in the reverse direction to the sensing axis direction D1 is output from the second magnetic sensor 14b. As a result, even in the case where the current to be measured is a high current, it is possible to suppress magnetic saturation of the first and second magnetic sensors 14a and 14b. Therefore, it is possible to enlarge the measurement range (dynamic range) of the current sensor, and it is also possible to dispose the first and second magnetic sensors 14a and 14b to approach the conductive member, thereby realizing the reductions in the size and the thickness of the current sensor 1.

In addition, the sensing axis directions D1 of the first and second magnetic sensors 14a and 14b are fixed in the same direction, and the magnetic vectors M2 and M4 of the induction magnetic field M1 are applied from the reverse directions to each other to the first and second magnetic sensors 14a and 14b. Therefore, the output signals having reversed phases to each other are output from the first and second magnetic sensors 14a and 14b. Therefore, by performing differential operation on the output signals of the first and second magnetic sensors 14a and 14b, the output signals of the first and second magnetic sensors 14a and 14b are added, thereby increasing detection sensitivity. Moreover, since disturbance magnetism is applied in the same direction to the first and second magnetic sensors 14a and 14b, it is possible to cancel noise due to the disturbance magnetism by performing differential operation on the output signals of the first and second magnetic sensors 14a and 14b.

Moreover, in the current sensor 1 according to this embodiment, the substrate 13 is disposed in the vicinity of the end surface 12c of the conductive member 12, and the pair of first and second magnetic sensors 14a and 14b are disposed with the substrate 13 interposed therebetween, thereby reducing the distance between the first and second magnetic sensors 14a and 14b. As such, by disposing the first and second magnetic sensors 14a and 14b to approach each other, the difference between the disturbance magnetism applied to the first magnetic sensor 14a and the disturbance magnetism Hc applied to the second magnetic sensor 14b may be reduced, thereby effectively canceling an influence of the disturbance magnetism Hc.

Particularly, in the current sensor 1 according to this embodiment, by disposing the position at the center (the point P1) in the thickness direction of the substrate 13 and the position at the center (the point P2) in the lateral direction D2 of the conductive member 12 in the same surface F1, the magnitude of the magnetic vector M2 applied to the first magnetic sensor 14a and the magnitude of the magnetic vector M4 applied to the second magnetic sensor 14b are maximized. As a result, the detection sensitivity of the current to be measured may be enhanced.

The present invention is not limited to the above-described embodiment, and various modifications can be made. For example, the sizes of the elements in the above-described embodiment may be appropriately changed. In addition, in the above-described embodiment, the case where the magnetoresistance element is used in the magnetic balance type current sensor is described. Alternatively, the magnetic balance type current sensor may also be configured using a Hall element or other magnetic detection elements. Besides, the present invention may be appropriately modified without departing from the scope of the present invention.

For example, in the current sensor 1 according to the above-described embodiment, the configuration in which the conductive member 12 having a rectangular shape in the cross-sectional view is used is described. However, the shape of the conductive member 12 is not limited to this configuration and may be appropriately modified. The shape of the conductive member 12 may be appropriately modified to, for example, an elliptical shape or a flat shape in the cross-sectional view as long as the shape is in a range in which the effect of the present invention is obtained.

In addition, the first and second magnetic sensors 14a and 14b are not limited to this configuration, and may have any configuration as long as the induction magnetic field from the current to be measured, which flows through the conductive member 12, is applied at the predetermined angle θ with respect to the sensing axis directions D1 of the first and second magnetic sensors 14a and 14b and thus the output signals having reversed phases to each other are output. The reversed phases mentioned here include a range in which a phase shift to a degree that sufficient output signals are obtained after differential operation occurs.

Moreover, in the current sensor 1 according to the above-described embodiment, the angles θ of the induction magnetic field M1 applied to the first and second magnetic sensors 14a and 14b may be different angles as long as the angles are in a range in which magnetic saturation of the first and second magnetic sensors 14a and 14b is suppressed.

In addition, the substrate 13 is not limited to this configuration and may be any configuration as long as the configuration is in a range in which the reductions in the size and the thickness of the current sensor 1 are achieved. For example, the substrate 13 may be disposed so that the position at the center in the thickness direction is the same position as the position at the center in the height direction (the lateral direction D2) of the conductive member 12. In addition, the position at the center in the thickness direction may not be completely the same position as the position at the center in the height direction (the lateral direction D2) of the conductive member 12 and may be substantially the same in a range in which the effect of the present invention is exhibited. Moreover, the substrate 13 may be disposed to be tilted at a predetermined angle with respect to the longitudinal direction of the conductive member 12.

Moreover, in the current sensor 1 according to the above-described embodiment, a first control unit which operates and processes the output signal of the first magnetic sensor 14a and a second control unit which operates and processes the output signal of the second magnetic sensor 14b may be separately provided. In this case, it is preferable that the first and second magnetic sensors 14a and 14b and the first and second control units be provided on the upper surface and the lower surface of the substrate 13 to be vertically symmetrical. In this configuration, disturbance magnetism is uniformly applied to the first and second magnetic sensors 14a and 14b and the first and second control units, and thus noise due to the disturbance magnetism may be effectively reduced.

In addition, in the current sensor 1 according to the above-described embodiment, it is preferable that the control unit 20 be provided at a position separated from the conductive member 12 in the surface of the substrate 13 in terms of reducing noise from the conductive member 12.

Moreover, in the current sensor 1 according to the above-described embodiment, a shielding member (an electromagnetic shield) may be provided between the conductive member 12 and the substrate 13. By providing the shielding member as such, noise caused by a voltage of the conductive member 12 may be absorbed, and thus the measurement accuracy of the current to be measured may be enhanced.

Furthermore, the above-described embodiment has the configuration in which the magnetic balance type sensors are used as the first and second magnetic sensors but is not limited to this configuration. The magnetic sensors may output the output signals having reversed phases to each other due to the induction magnetic field from the current to be measured which passes through the current wire, and may use, for example, magnetic proportion type sensors. By using the magnetic proportion type sensors, it is possible to reduce power consumption compared to the configuration in which the magnetic balance type sensor is used.

The present invention has effects of reducing noise from disturbance magnetism, measuring the current to be measured which is a high current, and realizing reductions in size and thickness. Particularly, it is possible to appropriately use the present invention for a current sensor which detects the magnitude of a current for driving the motor of an electric vehicle or a hybrid vehicle.

It should be understood by those skilled in the art that various modifications, combinations, sub-combinations and alterations may occur depending on design requirements and other factors insofar as they are within the scope of the appended claims of the equivalents thereof.

What is claimed is:

1. A current sensor comprising:
a conductive member through which a current to be measured flows, the conductive member having a cross-sectional shape extending in a first direction longer than in a second direction;
a substrate having a first surface and a second surface substantially parallel to the first direction;
a first magnetic sensor and a second magnetic sensor disposed on the first surface and the second surface, respectively, the first and second magnetic sensors being configured to output first and second output signals, respectively, due to an induction magnetic field applied thereto from the current to be measured, the first and second output signals having respective phases opposite to each other; and
a differential amplifier configured to obtain a differential value between the first output signal and the second output signal,
wherein the first magnetic sensor and the second magnetic sensor have a first sensing axis and a second sensing axis, respectively, both fixed in a same sensing axis direction, the direction of the first sensing axis forming a predetermined angle with respect to a direction of the induction magnetic field applied to the first magnetic sensor, and a reverse direction of the second sensing axis forming an angle substantially same as the predetermined angle with respect to a direction of the induction magnetic field applied to the second magnetic sensor.

2. The current sensor according to claim 1, wherein a position of a center of the substrate in a thickness direction thereof and a position of a center of the conductive member in a height direction thereof are aligned on a same line.

3. The current sensor according to claim 1, wherein the conductive member has a substantially rectangular shape in the cross-sectional view.

4. The current sensor according to claim 1, wherein the first magnetic sensor and the second magnetic sensor are magnetoresistance elements.

5. The current sensor according to claim 1, wherein the first and second magnetic sensors are arranged such that a vector component of the induction magnetic field applied to the first magnetic sensor along the sensing axis direction is opposite to a corresponding vector component of the induction magnetic field applied to the second magnetic sensor along the sensing axis direction.

* * * * *